(12) United States Patent
Kronholz et al.

(10) Patent No.: US 8,334,185 B2
(45) Date of Patent: Dec. 18, 2012

(54) EARLY EMBEDDED SILICON GERMANIUM WITH INSITU BORON DOPING AND OXIDE/NITRIDE PROXIMITY SPACER

(75) Inventors: Stephan Kronholz, Dresden (DE); Matthias Kessler, Dresden (DE); Ricardo Mikalo, Heideblick (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/089,799

(22) Filed: Apr. 19, 2011

(65) Prior Publication Data
US 2012/0267683 A1    Oct. 25, 2012

(51) Int. Cl.
*H01L 21/336* (2006.01)
(52) U.S. Cl. ............... 438/303; 438/275; 257/E21.431
(58) Field of Classification Search ............ 257/E21.4, 257/E21.457, E21.536
See application file for complete search history.

(56) References Cited

U.S. PATENT DOCUMENTS

| | | | |
|---|---|---|---|
| 7,494,858 B2 | 2/2009 | Bohr et al. | |
| 2007/0004123 A1* | 1/2007 | Bohr et al. | 438/230 |
| 2007/0235817 A1* | 10/2007 | Wang et al. | 257/392 |
| 2009/0191679 A1* | 7/2009 | Ouyang et al. | 438/276 |
| 2011/0037103 A1* | 2/2011 | Yamaguchi et al. | 257/255 |
| 2011/0070701 A1* | 3/2011 | Ning et al. | 438/199 |

* cited by examiner

*Primary Examiner* — Cheung Lee
(74) *Attorney, Agent, or Firm* — Ditthavong Mori & Steiner, P.C.

(57) ABSTRACT

Devices are formed with an oxide liner and nitride layer before forming eSiGe spacers. Embodiments include forming first and second gate stacks on a substrate, forming an oxide liner over the first and second gate stacks, forming a nitride layer over the oxide liner, forming a resist over the first gate stack, forming nitride spacers from the nitride layer over the second gate stack, forming eSiGe source/drain regions for the second gate stack, subsequently forming halo/extension regions for the first gate stack, and independently forming halo/extension regions for the second gate stack. Embodiments include forming the eSiGe regions by wet etching the substrate with TMAH using the nitride spacers as a soft mask, forming sigma shaped cavities, and epitaxially growing in situ boron doped eSiGe in the cavities.

11 Claims, 4 Drawing Sheets

EARLY EMBEDDED SILICON GERMANIUM WITH INSITU BORON DOPING AND OXIDE/NITRIDE PROXIMITY SPACER

TECHNICAL FIELD

The present disclosure relates to semiconductor devices with embedded silicon germanium source/drain regions. The present disclosure is particularly applicable to semiconductor devices in 28 nanometer (nm) technology nodes and beyond.

BACKGROUND

Conventional CMOS scaling techniques have been employed to improve device and product performance in VLSI circuits for many years. However, continued aggressive device scaling is challenged by physical limitations, exponentially increasing transistor gate currents, and progressively higher power consumption induced by these changes. Moreover, transistor behavior differs across pitch and for different types of transistors such as regular $V_t$, zero $V_t$, high $V_t$, and low $V_t$.

Transistor performance may be enhanced by inducing compressive stress into the PFET channel region or tensile stress into the NFET channel region. Compressive stress causes an improvement of the hole mobility, which leads to a better performance of the PFET. To create compressive stress in the p-channel region, cavities may be etched and subsequently filled by an epitaxially grown silicon germanium (eSiGe) layer. The distance between the channel region and the eSiGe cavity, and, therefore, the degree of stress injection, can be tuned using a differential disposable spacer (DDS). The thinner the DDS, the closer the distance between the eSiGe and the channel region, and the higher the degree of stress injection. However, the thinness of the nitride layer used for the DDS is limited, as the polysilicon gate integrity also must be preserved. Currently, minimum distances between the channel region and embedded SiGe are around 50 angstroms (Å) to 80 Å of DDS spacer width inside the SRAM area.

FIGS. 1A through 1E illustrate a conventional process flow for forming an NFET 101 and a PFET 103 for 90 nanometer (nm) and 45 nm technology node devices. Adverting to FIG. 1A, gate electrodes 105 and 107 (each with a high-k dielectric, such as hafnium oxide, thereunder) and nitride caps 109 and 111, respectively, are patterned and etched on substrate 113. Gate electrodes 105 and 107 are subjected to high temperatures in an oxidizing ambient environment, forming a reoxidation (Reox) layer 115 to a thickness of 23 angstroms (Å). A nitride layer 117, such as silicon nitride, is then formed to a thickness of 60 Å to 100 Å over substrate 113, NFET 101 and PFET 103, as illustrated in FIG. 1B. In FIG. 1C, a resist 119 is formed over NFET 101 with an opening over PFET 103 (including the source and drain regions). A two-in-one anisotropic etch is performed, for example by a reactive ion etch (RIE), to form DDS 121 and cavities 123 for the PFET active areas. Adverting to FIG. 1D, resist 119 is stripped and cleaned, and eSiGe is grown in cavities 123 forming source/drain regions 125. Nitride layer 117 and DDS 121 are then removed with a sulfuric acid and hydrogen peroxide mixture (SPM)/hot ammonia and hydrogen peroxide mixture (APM) sequence, and nitride or oxide spacers 127 are formed on both NFET 101 and PFET 103, as shown in FIG. 1E. Since halo/extension region implantation is performed prior to etching cavities 123, and such areas are left unprotected when nitride layer 117 is removed, the APM destroys the implants, thereby degrading $V_t$ behavior.

Another method for improving stress injection in the eSiGe module involves increasing the germanium (Ge) fraction within the epitaxial layer. In 45 nanometer (nm) devices, a gradation of Ge content has been employed. Ge content has been increased from 21% to 27%. However, higher Ge percentages have been found to cause stacking faults, or dislocations, and twins after epitaxy.

A need therefore exists for methodology enabling increased stress injection in the eSiGe module while decreasing Vt behavior.

SUMMARY

An aspect of the present disclosure is a method of fabricating a high-K/metal gate semiconductor device by forming an oxide liner prior to the nitride layer used to form eSiGe spacers and epitaxially growing in situ boron doped eSiGe in sigma shaped source drain regions.

Another aspect of the present disclosure is a high-K/metal gate semiconductor device with in situ boron doped eSiGe epitaxially grown in sigma shaped source drain regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming first and second gate stacks on a substrate; forming an oxide liner over the first and second gate stacks; forming a nitride layer over the oxide liner; forming a resist over the first gate stack; forming nitride spacers from the nitride layer over the second gate stack; forming embedded silicon germanium (eSiGe) source/drain regions for the second gate stack; forming halo/extension regions for the first gate stack subsequent to forming the eSiGe source/drain regions; and forming halo/extension regions for the second gate stack independently from the halo/extension regions for the first gate stack.

Aspects of the present disclosure include forming in situ boron doped eSiGe source/drain regions. Further aspects include forming the in situ boron doped eSiGe source/drain regions by: wet etching the substrate with tetramethyl-ammoniumhydroxide (TMAH) using the nitride spacers as a soft mask, forming sigma shaped cavities; and epitaxially growing in situ boron doped eSiGe in the cavities. Other aspects include forming the eSiGe source/drain regions with 15% to 50% germanium. Another aspect include forming the oxide liner to a thickness of 20 Å to 60 Å. Additional aspects include removing the nitride layer and nitride spacers subsequent to forming the eSiGe source/drain regions; and forming the halo/extension implants for the first gate stack through the oxide liner. Further aspects include forming oxide spacers from the oxide liner on the first gate stack; and using the oxide spacers to form the halo/extension implants for the first gate stack. Other aspects include forming additional spacers on the oxide liner on the second gate stack; and using the oxide liner and additional spacers to form to the halo/extension implants for the second gate stack. Additional aspects include forming the first and second gate stacks with nitride caps; and removing the nitride caps with ammonia and hydrogen peroxide mixtures (APM) subsequent to forming the first and second halo/extension regions.

Another aspect of the present disclosure is a device including: first and second gate stacks on a substrate; an oxide liner over the first and second gate stacks; a nitride layer over the oxide liner; embedded silicon germanium (eSiGe) source/drain regions on each side of the second gate stack; first halo/extension regions for the first gate stack formed subsequent to forming the eSiGe source/drain regions; and second halo/extension regions for the second gate stack formed independently from the first halo/extension regions for the first gate stack.

Aspects include a device including in situ boron doped eSiGe source/drain regions. Further aspects include a device including eSiGe source/drain regions having 15% to 50% germanium. Another aspect includes a device including sigma shaped eSiGe source/drain regions. An additional aspect includes a device including an oxide liner having a thickness of 20 Å to 60 Å. Other aspects include a device including an oxide liner forming oxide spacers on the first gate stack for forming the first halo/extension regions, and the oxide liner and additional oxide or nitride forming spacers on the second gate stack for forming the second halo/extension regions.

Another aspect of the present disclosure is a method including: forming an n-type gate stack and a p-type gate stack, each with a nitride cap; forming an oxide liner over the n-type and p-type gate stacks; forming a nitride layer over the oxide liner on the n-type gate stack; forming nitride spacers on the oxide liner on the p-type gate stack; wet etching the substrate with tetramethylammoniumhydroxide (TMAH) using the nitride spacers as a soft mask, forming sigma shaped cavities adjacent the p-type gate stack; epitaxially growing in situ boron doped eSiGe in the cavities; removing the nitride layer and nitride spacers with a sulfuric acid and hydrogen peroxide mixture (SPM)/APM sequence; implanting halo/extension dopants for the n-type gate stack; forming oxide or nitride spacers on the oxide liner over the p-type gate stack; and implanting halo/extension dopants for the p-type gate stack.

Aspects include forming the oxide liner to a thickness of 20 Å to 60 Å. Further aspects include epitaxially growing eSiGe having a germanium content of 15% to 50%. Another aspect includes removing the nitride caps by APM subsequent to forming the halo/extension regions for the p-type gate stack. Additional aspects include forming oxide spacers from the oxide liner subsequent to growing the eSiGe; and using the oxide spacers to implant the halo/extension dopants for the n-type gate stack.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
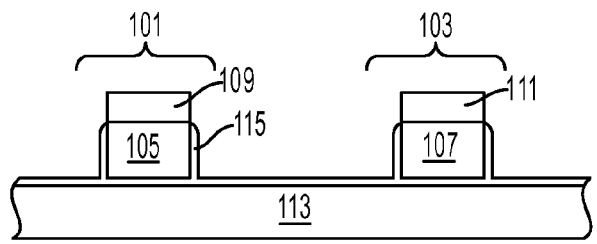
FIGS. 1A through 1E schematically illustrate a current process flow for the eSiGe module in manufacturing an NFET and a PFET.
Figure 1B:
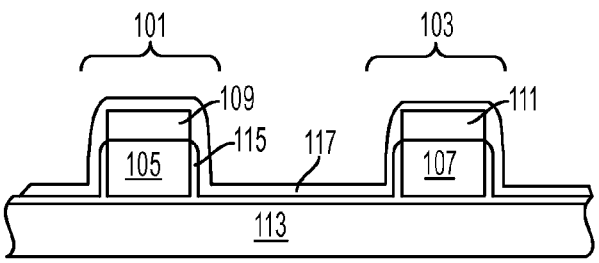
Figure 1C:
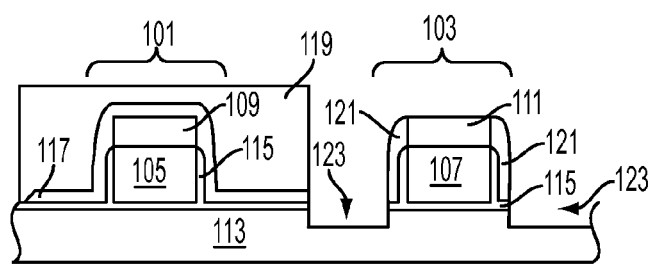
Figure 1D:
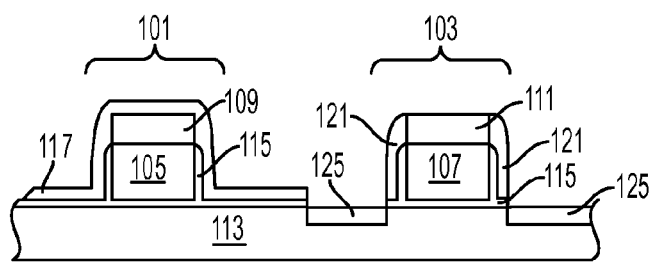
Figure 1E:
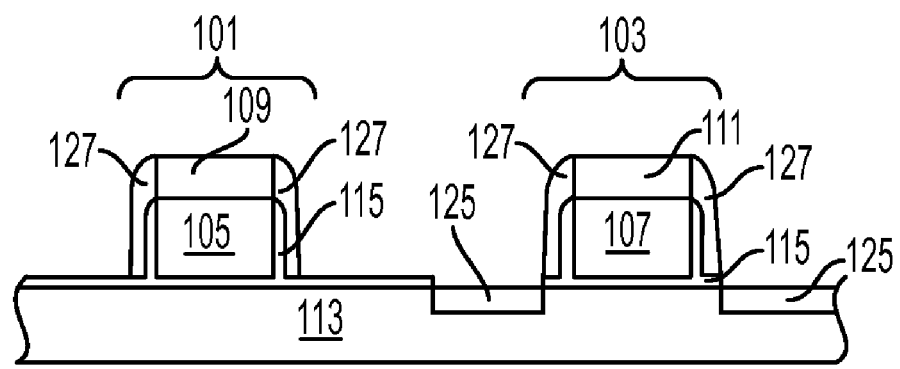

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of insufficient stress injection in the PFET eSiGe source/drain regions, as well as dopant loss, and increased $V_t$ behavior, attendant upon eSiGe source/drain formation and subsequent nitride removal. In accordance with embodiments of the present disclosure, stress injection is increased due to shallower proximity from the sigma shape eSiGe regions and inclusion of boron in the eSiGe. Further, by employing an oxide liner under the conventional nitride layer to protect the NFET and to form PFET spacers, halo/extension regions are protected from dopant loss, and differential spacers are formed for the NFET and PFET, thereby decoupling the NFET and PFET and enabling an additional degree of freedom to better tune PMOS and NMOS sensitivities.

Methodology in accordance with embodiments of the present disclosure includes forming first and second gate stacks on a substrate, forming an oxide liner over the first and second gate stacks, forming a nitride layer over the oxide liner, forming a resist over the first gate stack, forming nitride spacers from the nitride layer over the second gate stack, forming embedded silicon germanium (eSiGe) source/drain regions for the second gate stack, forming halo/extension regions for the first gate stack subsequent to forming the eSiGe source/drain regions, and forming halo/extension regions for the second gate stack independently from the halo/extension regions for the first gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2H schematically illustrate a process flow for the eSiGe module, in accordance with an exemplary embodiment. Adverting to FIG. 2A, formation of NFET 201 and PFET 203 begins as in current practice with gate electrodes 205 and 207 (each with a high-k dielectric, for example hafnium oxide, thereunder) and nitride caps 209 and 211, respectively, being patterned and etched on substrate 213. Gate electrodes 205 and 207 are subjected to high temperatures in an oxidizing ambient environment, forming a Reox layer 215 to a thickness of 23 Å.

Figure 2A:
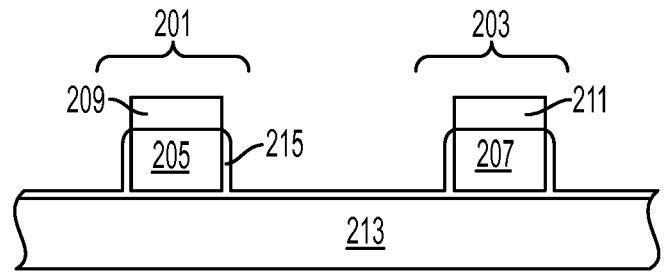
FIGS. 2A through 2H schematically illustrate a process flow for the eSiGe module, in accordance with an exemplary embodiment.
Figure 2B:
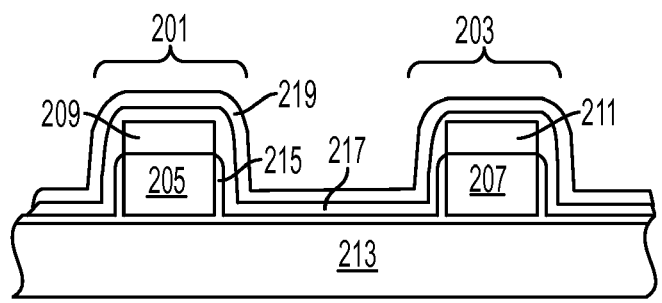

As illustrated in FIG. 2B, an oxide liner 217 is formed over substrate 213, NFET 201 and PFET 203, for example by chemical vapor deposition (CVD), rapid thermal anneal (RTA) growth, or monolayer deposition, to a thickness of 20 Å to 60 Å. A nitride layer 219, such as silicon nitride, is formed over oxide liner 217, for example by low pressure chemical vapor deposition (LPCVD).

Figure 2C:
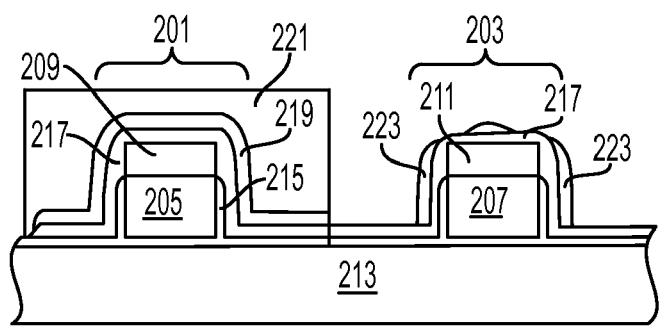

Adverting to FIG. 2C, a lithographic mask is formed over NFET 201, with an opening over PFET 203. DDS spacers 223 are etched from nitride layer 219, and a hafnium oxide breakthrough is performed.

Figure 2D:
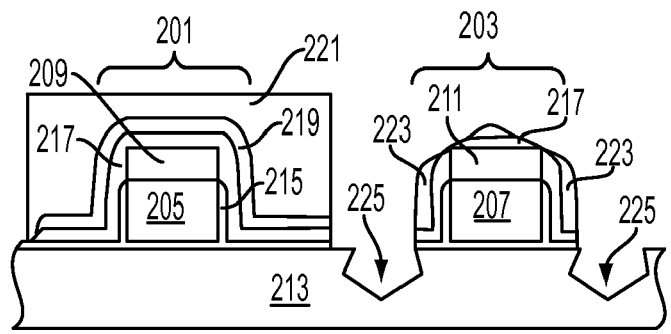

As illustrated in FIG. 2D, a cavity 225 is wet etched with tetramethylammoniumhydroxide (TMAH) in substrate 213 on each side of gate electrode 207. Instead of the conventional u-shape, cavities 225 are sigma, or diamond, shaped. The sigma shape improves the stress injection due to shallower proximity.

Figure 2E:
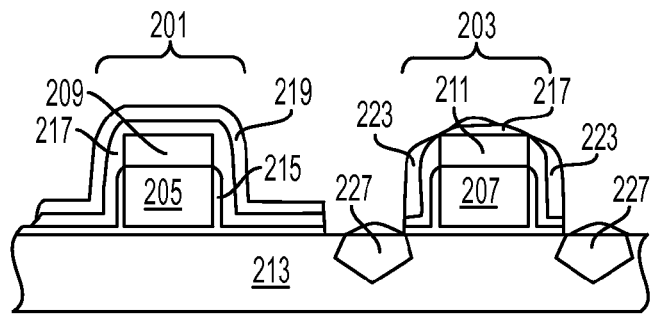

Then, resist 221 is stripped, and in situ boron doped (ISBD) eSiGe is epitaxially grown to fill cavities 225 to form source/drain regions 227 of PFET 203 (see FIG. 2E). The boron allows an increase in the germanium content of the eSiGe to 15% to 50% without causing stacking faults. The sigma shape and inclusion of boron in the eSiGe together enable predicted transistor behavior across transistor pitches.

Figure 2F:
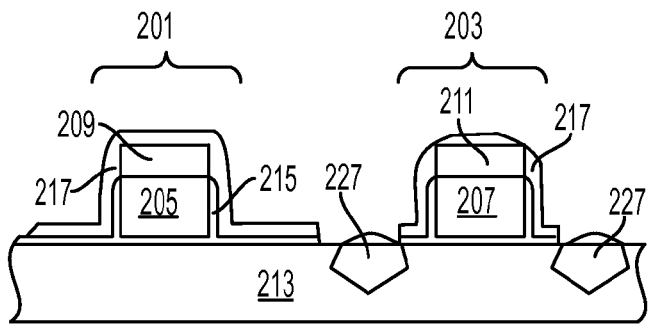

After source/drain regions 227 are formed, nitride DDS 223 and nitride layer 219 are removed, for example by an SPM/APM sequence, as illustrated in FIG. 2F. During nitride removal, oxide liner 217 protects the active silicon between gate electrode 207 and the eSiGe source/drain regions 227 from removal or recess, which reduces $V_t$ behavior, particularly for low power products.

Figure 2G:
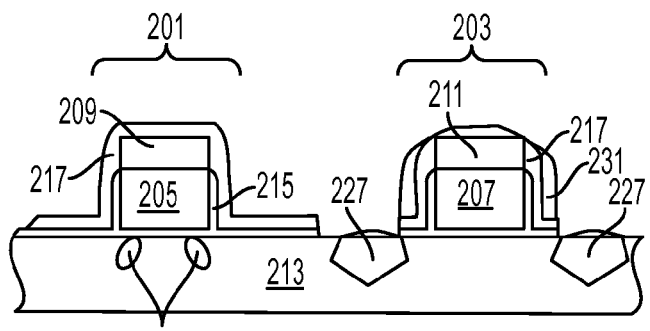

Adverting to FIG. 2G, NFET halo/extension implants 229 may now be performed through exposed oxide liner 217. Alternatively, oxide liner 217 may be etched by RIE to form oxide spacers (not shown for illustrative convenience), and the oxide spacers may be employed for the NFET halo/extension implants. Oxide or nitride spacers 231 may then be formed on PFET 203 for forming PFET halo/extension implants 233.

Figure 2H:
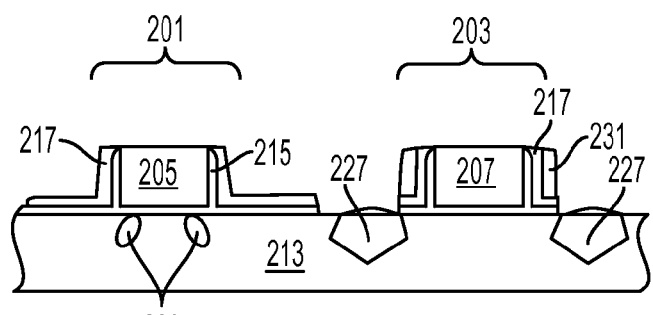

Nitride caps 209 and 211 may then be selectively removed by hot APM, as illustrated in FIG. 2H. For a 400 Å thick nitride cap, 60° C. APM may, for example, be applied for 13 minutes. Such APM also removes 2 Å of oxide per minute. Accordingly, the oxide liner 217 in the example to protect the halo/extension implants and prevent dopant loss during nitride cap removal, oxide liner 217 must be at least 3 nm in thickness. Oxide liner 217 must also be thin enough to enable a contact etch. That is why oxide liner 217 is formed to a thickness of 20 Å to 60 Å. Oxide liner and 28 nm IRAD nitride may form spacers (not shown for illustrative convenience) for NFET source/drain implants followed by PFET source/drain implants, and a 1060° C. anneal and laser spike anneal (LSA) activates the implants.

The embodiments of the present disclosure can achieve several technical effects, including improved stress injection, predicted transistor behavior across transistor pitches, reduced dopant loss, and thereby reduced $V_t$ behavior. Also, with differential spacers, the NFET and PFET may be decoupled, thereby enabling an additional degree of freedom to better tune PMOS and NMOS sensitivities. The present disclosure enjoys industrial applicability in any of various types of highly integrated semiconductor technologies, particularly in 32 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second gate stacks, each with a nitride cap, on a substrate;
   forming an oxide liner over the first and second gate stacks;
   forming a nitride layer over the oxide liner;
   forming a resist over the first gate stack;
   forming nitride spacers from the nitride layer over the second gate stack;
   forming embedded silicon germanium (eSiGe) source/drain regions for the second gate stack;
   removing the nitride layer and nitride spacers;
   forming halo/extension regions for the first gate stack through the oxide liner, or forming oxide spacers from the oxide liner on the first gate stack, and using the oxide spacers to form the halo/extension regions for the first gate stack;
   forming halo/extension regions for the second gate stack independently from the halo/extension regions for the first gate stack; and
   removing the nitride caps with ammonia and hydrogen peroxide mixtures (APM) subsequent to forming the halo/extension regions for the first and second gate stacks.

2. The method according to claim 1, comprising forming in situ boron doped eSiGe source/drain regions.

3. The method according to claim 2, comprising forming the in situ boron doped eSiGe source/drain regions by:
   wet etching the substrate with tetramethylammoniumhydroxide (TMAH) using the nitride spacers as a soft mask, forming sigma shaped cavities; and
   epitaxially growing in situ boron doped eSiGe in the cavities.

4. The method according to claim 3, comprising forming the eSiGe source/drain regions with 15% to 50% germanium.

5. The method according to claim 4, comprising forming the oxide liner to a thickness of 20 Å to 60 Å.

6. The method according to claim 1, further comprising
   forming additional spacers on the oxide liner on the second gate stack; and
   using the oxide liner and additional spacers to form halo/extension implants for the second gate stack.

7. A method comprising:
   forming an n-type gate stack and a p-type gate stack, each with a nitride cap;
   forming an oxide liner over the n-type and p-type gate stacks;
   forming a nitride layer over the oxide liner on the n-type gate stack;
   forming nitride spacers on the oxide liner on the p-type gate stack;
   wet etching the substrate with tetramethylammoniumhydroxide (TMAH) using the nitride spacers as a soft mask, forming sigma shaped cavities adjacent the p-type gate stack;
   epitaxially growing in situ boron doped eSiGe in the cavities;
   removing the nitride layer and nitride spacers with a sulfuric acid and hydrogen peroxide mixture (SPM)/ammonia and hydrogen peroxide mixtures (APM sequence;
   implanting halo/extension dopants for the n-type gate stack;

forming oxide or nitride spacers on the oxide liner over the p-type gate stack; and implanting halo/extension dopants for the p-type gate stack.

8. The method according to claim 7, comprising forming the oxide liner to a thickness of 20 Å to 60 Å.

9. The method according to claim 8, comprising epitaxially growing eSiGe having a germanium content of 15% to 50%.

10. The method according to claim 9, further comprising removing the nitride caps by APM subsequent to forming the halo/extension regions for the p-type gate stack.

11. The method according to claim 10, comprising:
forming oxide spacers from the oxide liner subsequent to growing the eSiGe; and
using the oxide spacers to implant the halo/extension dopants for the n-type gate stack.

* * * * *